(12) United States Patent
Lee

(10) Patent No.: US 11,061,193 B2
(45) Date of Patent: Jul. 13, 2021

(54) SEMICONDUCTOR CHIP PACKAGE HAVING OPTICAL INTERFACE

(71) Applicant: Lipac Co., Ltd., Seoul (KR)

(72) Inventor: Sang Don Lee, Guri-si (KR)

(73) Assignee: Lipac Co., Ltd., Seoul (KR)

( * ) Notice: Subject to any disclaimer, the term of this patent is extended or adjusted under 35 U.S.C. 154(b) by 0 days.

(21) Appl. No.: 16/839,473

(22) Filed: Apr. 3, 2020

(65) Prior Publication Data

US 2020/0233157 A1    Jul. 23, 2020

Related U.S. Application Data

(63) Continuation of application No. 16/251,244, filed on Jan. 18, 2019, now Pat. No. 10,649,159, which is a (Continued)

(30) Foreign Application Priority Data

Nov. 11, 2015  (KR) .................. 10-2015-0158096
Oct. 28, 2016  (KR) .................. 10-2016-0141808

(51) Int. Cl.
   *G02B 6/42*       (2006.01)
   *H01L 23/538*     (2006.01)
   (Continued)

(52) U.S. Cl.
   CPC ........... *G02B 6/423* (2013.01); *G02B 6/4206* (2013.01); *G02B 6/428* (2013.01); *G02B 6/4242* (2013.01);
   (Continued)

(58) Field of Classification Search
   CPC .. G02B 6/4253; G02B 6/4212; G02B 6/4239; G02B 6/4242; G02B 6/4251; G02B 6/4255
   See application file for complete search history.

(56) References Cited

U.S. PATENT DOCUMENTS 6,879,040 B2   4/2005   Ng et al.
6,885,099 B2   4/2005   Ogawa
(Continued)

FOREIGN PATENT DOCUMENTS

CN   102820282 A    12/2012
EP   2 224 487 A2    9/2010
(Continued)

OTHER PUBLICATIONS

European Office Action for related EP application No. 16197590.9 dated Feb. 14, 2017 from European Patent Office.
(Continued)

*Primary Examiner* — Rhonda S Peace
(74) *Attorney, Agent, or Firm* — Paratus Law Group, PLLC

(57) ABSTRACT

A semiconductor package including: a chip having a first surface and a second surface; a mold configured to encapsulate the chip; a vertical conductive channel electrically connected to a pad formed on the second surface of the chip while passing through the mold; a wiring pattern electrically connected to a pad formed on the first surface of the chip and configured to perform electrical connection in the package; an optical device arranged on a surface of the semiconductor package to be electrically connected to the vertical conductive channel; and an external connection terminal configured to electrically connect the semiconductor package to the outside.

21 Claims, 13 Drawing Sheets

Related U.S. Application Data continuation of application No. 15/837,543, filed on Dec. 11, 2017, now Pat. No. 10,203,459, which is a continuation of application No. 15/348,193, filed on Nov. 10, 2016, now Pat. No. 9,864,153.

(51) Int. Cl.
*H01L 23/00* (2006.01)
*H01L 23/31* (2006.01)
*H01L 25/16* (2006.01)
*H01L 23/29* (2006.01)
*H01L 23/552* (2006.01)

(52) U.S. Cl.
CPC ........ *G02B 6/4256* (2013.01); *H01L 23/5384* (2013.01); *H01L 23/5386* (2013.01); *H01L 24/48* (2013.01); *H01L 25/167* (2013.01); *G02B 6/4214* (2013.01); *G02B 6/4284* (2013.01); *H01L 23/293* (2013.01); *H01L 23/3128* (2013.01); *H01L 23/3135* (2013.01); *H01L 23/552* (2013.01); *H01L 2223/6677* (2013.01); *H01L 2224/04105* (2013.01); *H01L 2224/05599* (2013.01); *H01L 2224/12105* (2013.01); *H01L 2224/18* (2013.01); *H01L 2224/24137* (2013.01); *H01L 2224/24195* (2013.01); *H01L 2224/45144* (2013.01); *H01L 2224/48235* (2013.01); *H01L 2924/00014* (2013.01); *H01L 2924/12041* (2013.01); *H01L 2924/12042* (2013.01); *H01L 2924/12043* (2013.01); *H01L 2924/15153* (2013.01); *H01L 2924/1815* (2013.01)

(56) References Cited

U.S. PATENT DOCUMENTS

| | | | |
|---|---|---|---|
| 7,420,754 B2 | 9/2008 | Nagasaka | |
| 7,500,792 B2 | 3/2009 | Supper | |
| 7,551,811 B2 | 6/2009 | Aoki et al. | |
| 7,728,399 B2 | 6/2010 | Walberg et al. | |
| 8,174,119 B2* | 5/2012 | Pendse | H01L 24/13 257/738 |
| 8,372,741 B1 | 2/2013 | Co et al. | |
| 8,492,181 B2 | 7/2013 | Ramasamy et al. | |
| 8,779,583 B2 | 7/2014 | Pressel et al. | |
| 8,971,676 B1 | 3/2015 | Thacker et al. | |
| 9,105,766 B2* | 8/2015 | Coffy | G01S 7/481 |
| 9,502,335 B2 | 11/2016 | Lai et al. | |
| 9,864,153 B2 | 1/2018 | Lee | |
| 9,958,616 B2 | 5/2018 | Hu | |
| 10,203,459 B2 | 2/2019 | Lee | |
| 10,203,460 B2* | 2/2019 | Furuyama | G02B 6/4274 |
| 2001/0022370 A1 | 9/2001 | Meyer-Guldner | |
| 2002/0019174 A1 | 2/2002 | Crane, Jr. et al. | |
| 2002/0180040 A1 | 12/2002 | Camenforte et al. | |
| 2004/0004227 A1 | 1/2004 | Tateishi | |
| 2004/0175866 A1 | 9/2004 | Woerz et al. | |
| 2006/0027479 A1 | 2/2006 | Auburger et al. | |
| 2007/0114547 A1 | 5/2007 | Fujita et al. | |
| 2011/0128712 A1 | 6/2011 | Prest et al. | |
| 2011/0206379 A1 | 8/2011 | Budd et al. | |
| 2012/0313207 A1 | 12/2012 | Oganesian | |
| 2012/0319304 A1 | 12/2012 | Pressel et al. | |
| 2013/0164867 A1 | 6/2013 | Ramasamy et al. | |
| 2014/0151536 A1 | 6/2014 | Wu | |
| 2014/0169800 A1 | 6/2014 | Eid et al. | |
| 2015/0091177 A1 | 4/2015 | Hong et al. | |
| 2017/0131487 A1 | 5/2017 | Lee | |
| 2018/0100977 A1 | 4/2018 | Lee | |
| 2019/0170950 A1 | 6/2019 | Lee | |

FOREIGN PATENT DOCUMENTS

| | | |
|---|---|---|
| JP | 3990113 B2 | 10/2007 |
| KR | 10-2008-0032425 A1 | 4/2008 |
| KR | 10-0824155 B1 | 4/2008 |
| KR | 10-2012-0137254 A1 | 12/2012 |
| KR | 10-1362715 B1 | 2/2014 |
| WO | WO 94/11929 A2 | 5/1994 |
| WO | WO 2005/091368 A1 | 9/2005 |

OTHER PUBLICATIONS

Korean Office Action for related KR application No. 10-2016-0141808 dated Sep. 28, 2017 from Korean Patent Office.
Korean Office Action for related KR application No. 10-2016-0141808 dated May 30, 2018 from Korean Patent Office.
Korean Office Action for related KR application No. 10-2017-0183022 dated Mar. 27, 2018 from Korean Patent Office.
Korean Office Action for related KR application No. 10-2017-0183022 dated Oct. 30, 2018 from Korean Patent Office.
Chinese Office Action for related Chinese application No. 201610988797.X dated Nov. 23, 2018 from Chinese Patent Office.

* cited by examiner

SEMICONDUCTOR CHIP PACKAGE HAVING OPTICAL INTERFACE

CROSS REFERENCE TO PRIOR APPLICATIONS

This application is a Continuation of U.S. patent application Ser. No. 16/251,244 (filed on Jan. 18, 2019), which is a Continuation of U.S. patent application Ser. No. 15/837,543 (filed on Dec. 11, 2017 and issued as U.S. Pat. No. 10,203,459 on Feb. 12, 2019), which is a Continuation of U.S. patent application Ser. No. 15/348,193 (filed on Nov. 10, 2016 and issued as U.S. Pat. No. 9,864,153 on Jan. 9, 2018), which claims priority to Korean Patent Application Nos. 10-2015-0158096 (filed on Nov. 11, 2015) and 10-2016-0141808 (filed on Oct. 28, 2016), which are all hereby incorporated by reference in their entirety.

BACKGROUND

The present invention relates to a semiconductor chip package having an optical interface.

With the advent of digital network information times, products such as multimedia products, digital home appliances, personal digital devices, etc. have rapidly grown. Semiconductor chip package technology is to safely cover a semiconductor chip with an epoxy mold compound (EMC) so as to protect the semiconductor chip from external shocks, light, moisture, etc. This technology has been developed from technology of including only one chip in one package to multi-chip-package (MCP) technology or multi-chip-module (MCM) technology of including several chips in one package.

SUMMARY

An optical communication module should include a mechanical device which fixes an optical cable for transmitting an optical signal, an optical device which converts an optical signal transmitted from the optical cable into an electrical signal or an optical signal, which is to be transmitted to the optical cable, into an electrical signal, and an interface circuit which exchanges information with the optical device. In an optical communication module according to the related art, an optical-cable fixing member, an optical device, and interface circuit chips should be arranged to be spaced apart from one another on a circuit board according to different processes. Thus, an area of the circuit board increases, and a process of manufacturing the optical communication module is complicated. Furthermore, an electrical signal supplied from the optical device is provided to an opto-electronic circuit via conductive strips formed on the circuit board and may be thus deteriorated.

To solve the problems of the related art described above, embodiments set forth herein are directed to an optical communication module, in which an optical device and an optical interface circuit are formed in the same package to decrease an area of a circuit board and prevent a signal from being transmitted via conductive strips formed on the circuit board. Thus, a final circuit may be manufactured in a simple and economical manner and an electrical signal may be suppressed from being deteriorated.

According to an aspect of the present invention, a semiconductor package includes a chip having a first surface and a second surface; a mold configured to encapsulate the chip; a vertical conductive channel electrically connected to a pad formed on the second surface of the chip while passing through the mold; a wiring pattern electrically connected to a pad formed on the first surface of the chip and configured to perform electrical connection in the package; an optical device arranged on a surface of the semiconductor package to be electrically connected to the vertical conductive channel; and an external connection terminal configured to electrically connect the semiconductor package to the outside.

According to another aspect of the present invention, a semiconductor package includes a chip having a first surface; a mold configured to encapsulate the chip; a vertical conductive channel passing through the mold; an optical device arranged on a surface of the semiconductor package to be electrically connected to the vertical conductive channel; a wiring pattern configured to electrically connect the vertical conductive channel and a pad formed on the first surface of the chip, and perform electrical connection in the semiconductor package; and an external connection terminal configured to electrically connect the semiconductor package to the outside.

According to another aspect of the present invention, a semiconductor package includes a chip including a pad formed on a first surface thereof; a via-substrate including a via; a mold configured to encapsulate the chip and the via-substrate; a vertical conductive channel connected to the via while passing through the mold; an optical device arranged on a surface of the semiconductor package to be electrically connected to the vertical conductive channel; a wiring pattern configured to electrically connect the via and the pad to each other; and an external connection terminal configured to electrically connect the semiconductor package to the outside.

According to another aspect of the present invention, a semiconductor package includes a chip including a pad; an optical device including a pad; a mold configured to encapsulate the optical device and the chip; a wiring pattern configured to electrically connect the optical device and the chip; and an external connection terminal configured to electrically connect the semiconductor package to the outside.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION

Figure 1:
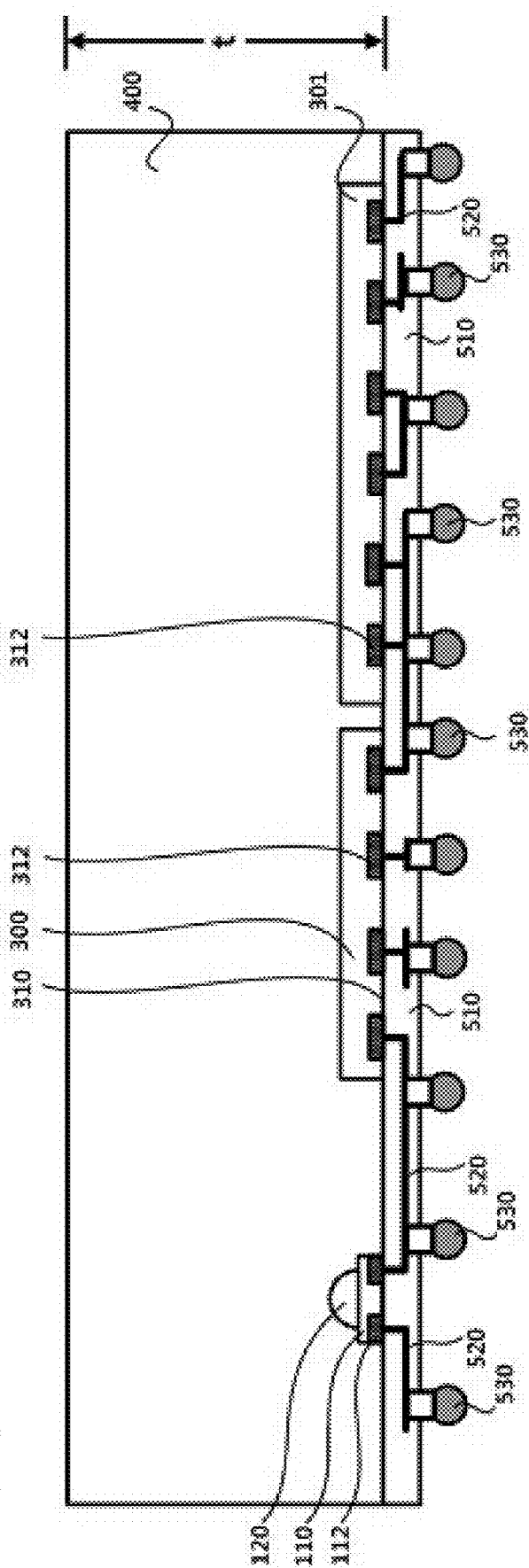
FIGS. 1 to 3 are schematic cross-sectional views of a semiconductor package having an optical interface according to a first embodiment.

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

The following description of the present invention merely provides embodiments describing structural and functional characteristics of the invention and thus the scope of the present invention should not be construed as being limited by embodiments set forth herein. That is, various changes may be made to these embodiments in forms and details and thus the scope of the present invention should be understood to include equivalents falling within the scope of the invention.

The terms used herein should be understood as will be described below.

The terms such as first, second, etc. are only used to distinguish one element from another element and thus the scope of the invention should not be limited by these terms. For example, a first element can be termed a second element, and a second element can be termed as first element.

It will be understood that when an element is referred to as being 'on' another element, the element can be directly on another element or intervening elements. In contrast, when an element is referred to as being 'in contact with' another element, there are no intervening elements therebetween. Other expressions describing the relationship between elements, e.g., 'via', "directly via', 'between', 'directly between', 'neighboring', 'directly neighboring', etc. should be understood similarly.

As used herein, the singular forms 'a', 'an' and 'the' are intended to include the plural forms as well, unless the context clearly indicates otherwise. It will be further understood that the terms 'comprise' and/or 'comprising,' when used in this specification, specify the presence of stated features, integers, steps, operations, elements, and/or components, but do not preclude the presence or addition of one or more other features, integers, steps, operations, elements, components, and/or groups thereof.

The operations of all methods described herein can be performed in an order different from that described herein unless the context clearly indicates otherwise. That is, the operations may be performed in the order described herein, may be performed substantially simultaneously with the order described herein, or may be performed in an order reverse to the order described herein.

In the drawings referred to describe embodiments of the invention, elements are intentionally exaggerated in size, height, thickness, etc. for convenience of explanation and for better understanding of the invention, and are not expanded or reduced in size at a ratio. Furthermore, in the drawings, some elements may be intentionally reduced in size and some elements may be intentionally expanded in size.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

First Embodiment

FIG. 1 is a schematic cross-sectional view of a semiconductor package having an optical interface according to a first embodiment. Referring to FIG. 1, a semiconductor package 10 according to the present embodiment includes chips 300 and 301 having pads 312, an optical device 110 having a pad 112, a mold 400 for encapsulating the optical device 110 and the chips 300 and 301, a wiring pattern 520 for electrically connecting the optical device 110 and the chips 300 and 301 to one another, and external connection terminals 530 for electrically connecting the semiconductor package 10 and the outside.

An optical module 100 includes the optical device 110 which converts an optical signal supplied thereto into an electrical signal corresponding to the optical signal or converts an electrical signal supplied thereto into an optical signal corresponding to the electrical signal. The optical module 100 may further include a lens part 120 on the optical device 110. In one embodiment, the optical device 110 may be a photodiode which generates an electrical signal corresponding to light supplied thereto. The photodiode supplies the electrical signal to the chips 300 and 301 via the wiring pattern 520 connected to the pads 312.

In another embodiment, the optical device 110 may be a light-emitting diode (LED) which generates an optical signal corresponding to an electrical signal supplied via the wiring pattern 520 or a vertical cavity surface emitting laser (VCSEL) which emits an optical signal in a direction perpendicular to surfaces of the chips 300 and 301. Light supplied from or to the optical device 110 is not limited to a wavelength of light such as an infrared ray, visible light, laser, or the like, and may be any type of light through which at least two sides may communicate with each other.

The lens part 120 includes a lens through which the optical device 110 may efficiently provide or concentrate light. Although FIG. 1 illustrates that the lens part 120 includes a convex lens, the present invention is not limited thereto and the lens part 120 may include a convex lens, a concave lens and/or a compound lens including a convex lens and a concave lens, or a transparent film other than a lens.

In the embodiment of FIG. 1, the optical device 110 exchanges an electrical signal with an interface chip via the wiring pattern 520 connected to the pads 112. In embodiments of FIGS. 2 and 3, a bonding wire w of the optical device 110 is in contact with one surface of an via 610 and a wiring pattern (520) is in contact with another surface of the via 610, thereby electrically connecting the optical device 110, the via 610, and the wiring pattern 520 with one another. In the present embodiment, when the optical device 110 is a light-receiving device, the optical device 110 generates an electrical signal corresponding to a received optical signal and provides it to the chips 300 and 301. When the optical device 110 is a light-emitting device, the chips 300 and 301 generate electrical signals and provide them to the optical device 110 and the optical device 110 provides optical signals corresponding to the received electrical signals to the outside.

Figure 4:
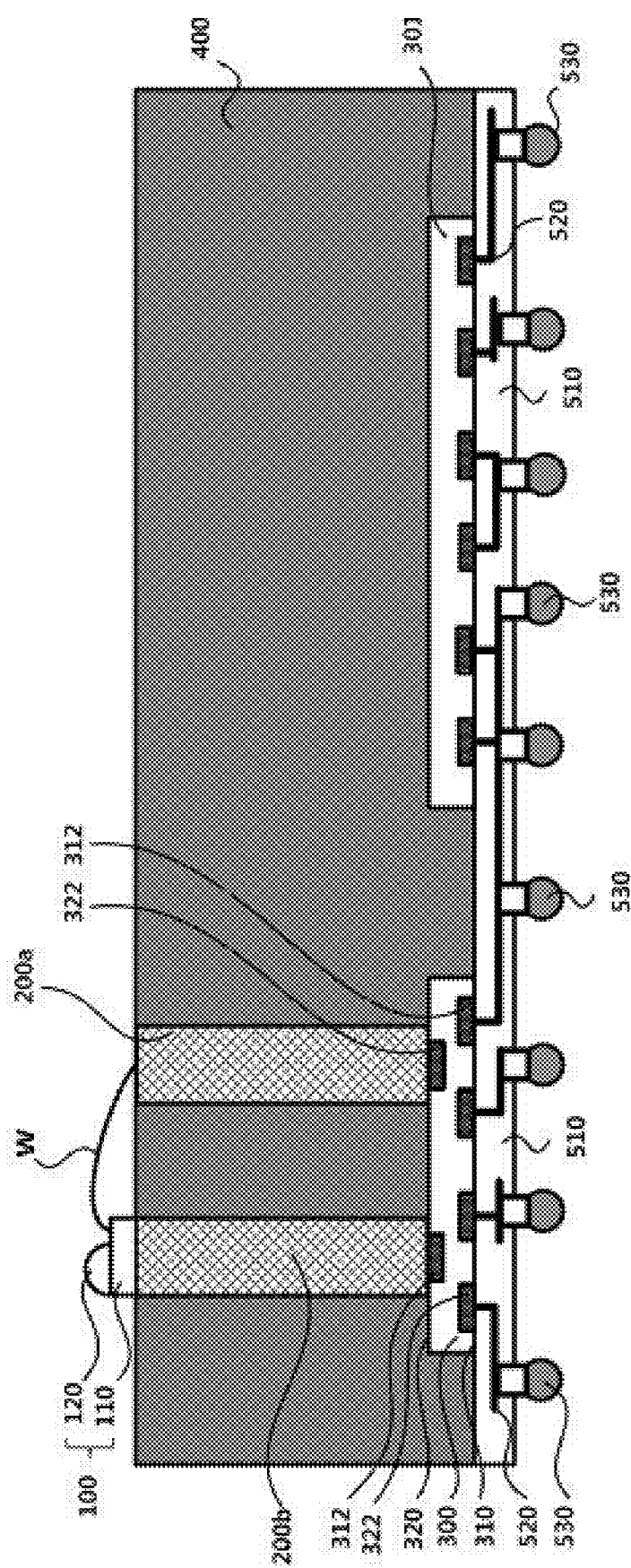
FIG. 4 is a schematic cross-sectional view of a semiconductor package having an optical interface according to a second embodiment.

The interface chip 300 includes a circuit (not shown) which performs a desired operation, and pads 312 and 322 which provide an input signal to the circuit and provide an output signal to the outside. In one embodiment, when the optical device 110 is a light-emitting device, the interface chip 300 may include a driver circuit which supplies an electrical signal so that the light-emitting device may provide light. When the optical device 110 is a light-receiving device, the chip 300 may include an amplifier circuit which amplifies an electrical signal corresponding to an optical signal generated by the light-receiving device or amplifies the electrical signal to a differential signal. In one embodiment, as illustrated in FIG. 1, the pads 312 are formed on a first surface 310 of the chip 300, and transmit a signal to the circuit or receive a signal from the circuit. In another embodiment, as illustrated in FIG. 4, pads 312 and 322 are formed on a first surface 310 and a second surface 320 of a chip 300 to transmit a signal to a circuit or receive a signal from the circuit.

FIG. 1 illustrates a system-in-package in which a plurality of chips are formed in one package. In FIG. 1 the chip 301 packaged with the chip 300 may be, for example, a chip including a circuit related to a signal processing system. In a semiconductor package according to another embodiment, a chip and a sub-package may be formed in the same package (see FIG. 3). In another embodiment (not shown), a chip having a light-emitting device, a driver circuit of the light-emitting device, a light-receiving device, and an amplifier circuit of the light-receiving device, and at least one signal processing chip may be formed in a semiconductor package.

The mold 400 encapsulates the chip 300. In one embodiment, the chips 300 and 301 are arranged on a carrier substrate (not shown) having a release tape (not shown) therebetween, an epoxy mold compound (EMC) layer is formed and hardened thereon, and then surface planarization is performed on a resultant structure. Then, the hardened EMC layer and the carrier substrate are separated from each other by using the release tape, thereby obtaining the hardened mold 400.

In one embodiment, the mold 400 is transparent. That the mold 400 is transparent should be understood to include a case in which a material of the mold 400 is transparent and a case in which a thickness t of the mold 400 is thin enough to transmit an optical signal supplied from the outside to the optical device 110 or to transmit light supplied from the optical device 110 to the outside of the semiconductor package 10. Thus, an optical signal may be supplied to the optical device 110 or may be supplied to the outside from the optical device 110 through the mold 400 which is transparent. In another embodiment, the mold 400 is opaque. When the mold 400 is opaque, an optical signal cannot be supplied to the optical device 110 from the outside or the optical device 110 cannot supply an optical signal to the outside. Thus, an opening 410 (see FIG. 2) into which an optical cable is inserted is formed in the mold 400 to transmit an optical signal to the optical device 110 or receive an optical signal from the optical device 110.

In one embodiment, a dielectric layer or a passivation layer 510, the wiring pattern 520, and the external connection terminals 530 are formed on the first surface 310. Here, each of the dielectric layer or the wiring pattern 520 may be formed in several layers if necessary. The dielectric layer or the passivation layer 510 is a film which insulates wiring patterns of several layers from one another or which blocks the exposed second surface 320 from the outside, and protects a surface of a semiconductor from an environment which is harmful to the surface of the semiconductor to stabilize characteristics of the semiconductor. The dielectric layer or the passivation layer 510 absorbs ions which alter characteristics of the surface of the semiconductor or prevents movement of the ions.

The wiring pattern 520 performs electrical connection in the semiconductor package 10. In one embodiment, the wiring pattern 520 is electrically connected to the pads 322 of the chips 300 and 301, and performs an electrical wiring function to transmit an electrically processed signal to the chip 301 or to transmit a signal supplied from the chip 301 to the chip 300. For example, the wiring pattern 520 may be formed by sputtering, evaporation, or the like. The wiring pattern 520 is formed of a conductive metal such as gold, silver, copper, or aluminum but is not limited thereto.

The external connection terminals 530 are electrically connected to the pads 322 formed on the second surface 320 via the wiring pattern 520. The external connection terminals 530 provide an electrical signal supplied from the outside of the semiconductor package 10 to the semiconductor package 10 or provide an electrical signal generated by the semiconductor package 10 to the outside of the semiconductor package 10. In one embodiment, the external connection terminals 530 are solder balls as illustrated in FIG. 1. In another embodiment (not shown), the external connection terminals 530 may be metal bumps.

Figure 2:
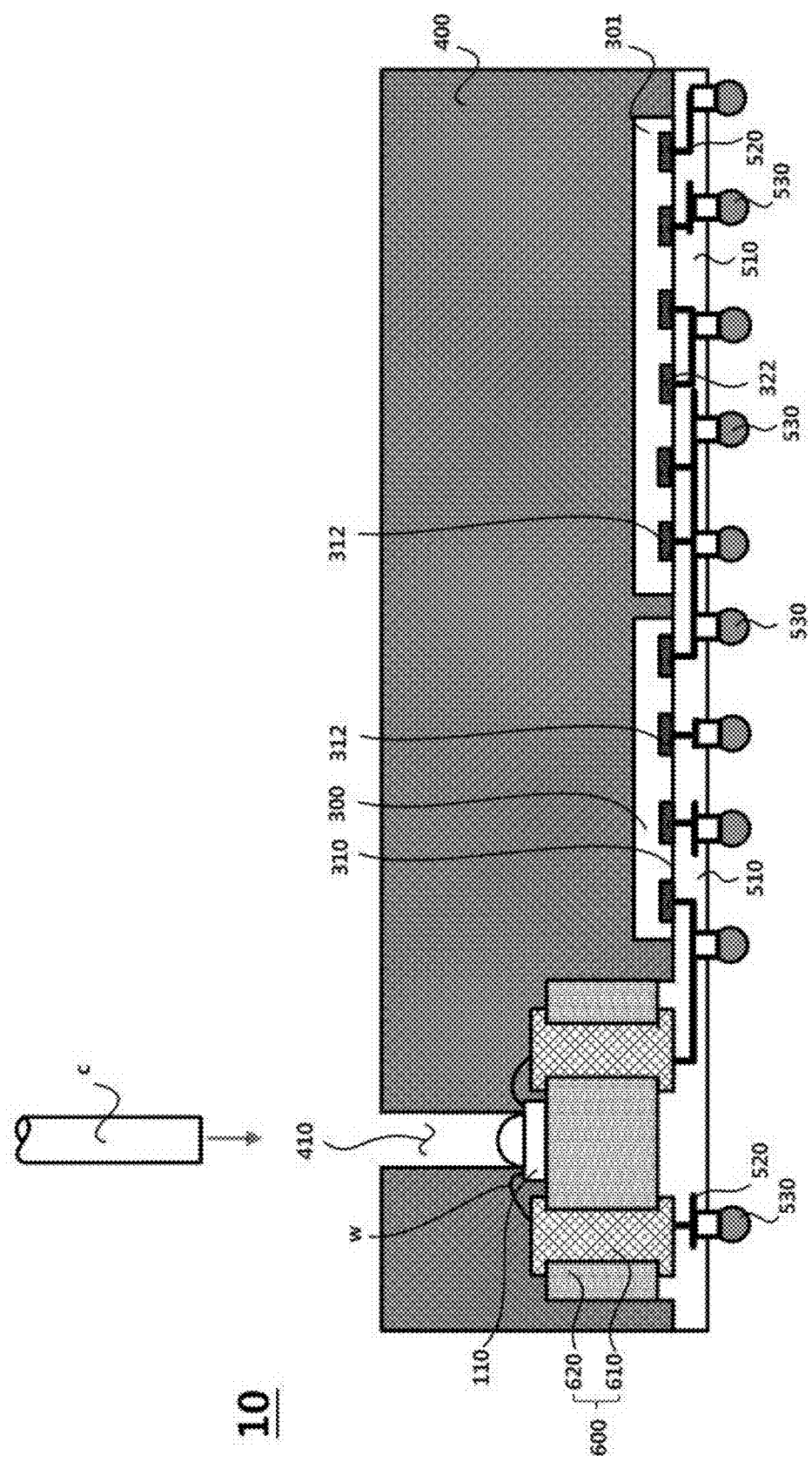

In the embodiment of FIG. 2, the optical device 110 may be disposed on a via-substrate 600, and may communicate an electrical signal with a chip through a via 610 formed on the via-substrate 600. The via-substrate 600 includes a thin-film substrate 620, and the via 610 passing through the thin-film substrate 620. The optical device 110 is disposed on one surface of the thin-film substrate 620. For example, the optical device 110 is electrically connected to the via 610 exposed on one surface of the thin-film substrate 620 through a wire w as illustrated in FIG. 2. In another embodiment (not shown), the optical device 110 is electrically connected to the via 610 when the pads 112 (see FIG. 1) formed on a rear surface of the optical device 110 are connected to the via 610 exposed on the one surface of the thin-film substrate 620. Another surface of the via 610 may be connected to the wiring pattern 520 to transmit an electrical signal to the chips 300 and 301 or receive an electrical signal from the chips 300 and 301.

When the mold 400 is an opaque mold, each of the optical device 110 and an optical cable c cannot transmit an optical signal to the other or receive an optical signal from the other. Thus, the opening 410 into which the optical cable c is inserted is formed in the mold 400. The opening 410 may be formed by penetrating the mold 400 by laser or may be formed according to a pattern formation and etching process as in a semiconductor process.

In one embodiment, a protective pattern (not shown) may be further formed on the optical device 110 or the lens part 120. The protective pattern protects the optical device 110 or the lens part 120 from laser when the opening 410 is formed, and may be a patterned metal layer.

Figure 3:
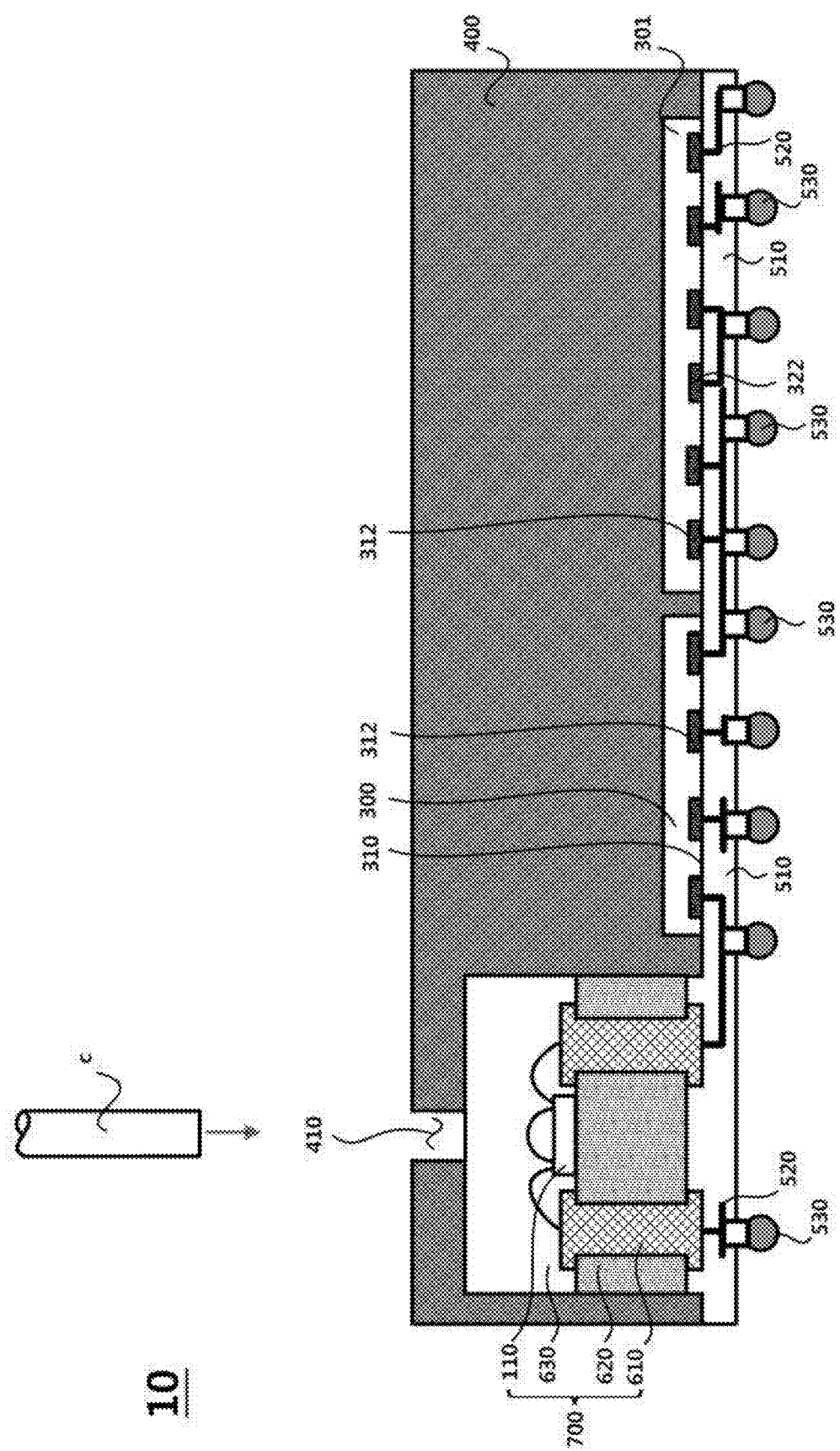

In the embodiment of FIG. 3, the optical device 110 placed on a thin-film substrate 620 and electrically connected to a via 610 is molded with a transparent film 630, thereby forming a sub-package 700. In the embodiment of FIG. 3, the sub-package 700 may further include a protective pattern (not shown) disposed on a surface of the transparent film 630. The protective pattern prevents the optical device 110, the lens part 120, or the transparent film 630 from being damaged by laser or an etching process when punching is performed.

The optical cable c is inserted into the semiconductor package 10 via the opening 410 to transmit an optical signal to the optical device 110 or to receive an optical signal from the optical device 110. In the embodiment of FIG. 2, an optical signal is transmitted to or received from the optical device 110 through the optical cable c. In the embodiment of FIG. 3, an optical signal is transmitted to or received from the optical device 110 through the optical cable c via the transparent film 630. The optical device 110 receives an electrical signal from a chip or transmits an electrical signal to the chip via the via 610 and the wiring pattern 520.

Second Embodiment

FIG. 4 is a schematic cross-sectional view of a semiconductor package having an optical interface according to a second embodiment. A semiconductor package having an optical interface according to the second embodiment will be described with reference to FIG. 4 below. For a concise and clear description, parts that are the same or substantially the same as the previous embodiment may not be described again here.

Referring to FIG. 4, a semiconductor package 12 according to the present embodiment includes a chip 300 having a first surface 310 and a second surface 320, a mold 400 which encapsulates the chip 300, vertical conductive channels 200a and 200b electrically connected to a pad 322 formed on the second surface 320 of the chip 300 while passing through the mold 400, a wiring pattern 520 electrically connected to a pad 312 formed on the first surface 310 of the chip 300 and performing electrical connection in the semiconductor package 12, an optical device 110 arranged on a surface of the semiconductor package 12 and electrically connected to the vertical conductive channels 200a and 200b, and external connection terminals 530 electrically connecting the semiconductor package 12 to the outside.

In one embodiment, the optical device 110 is electrically connected to the vertical conductive channel 200a through a pad formed on one surface of the optical device 110 and a wire w bonded to the optical device 110, and is electrically connected to the vertical conductive channel 200b when a pad formed on another surface of the optical device 110 is in contact with the vertical conductive channel 200b. In another embodiment (not shown), the optical device 110 is electrically connected to the vertical conductive channels 200a and 200b through pads formed on one surface of the optical device 110 and wires respectively connected to the vertical conductive channels 200a and 200b. In another embodiment (not shown), the optical device 110 may be electrically connected to the vertical conductive channels 200a and 200b when a pad formed on the other surface of the optical device 110 is in contact with the vertical conductive channels 200a and 200b.

The vertical conductive channels 200a and 200b pass through the mold 400, and are electrically connected to the pad 312 formed on the first surface 310 of the chip 300. In one embodiment, the vertical conductive channels 200a and 200b may be formed by penetrating the mold 400 by laser or by forming a through-hole according to a pattern formation and etching process and filling the through-hole with a conductive metal. The vertical conductive channels 200a and 200b may be formed of a metal such as gold, silver, or copper, but is not limited thereto and may be formed of any conductive metal. The vertical conductive channels 200a and 200b may be formed by filling the through-hole with a conductive metal by sputtering, evaporation, or plating and then planarizing a surface of the mold 400.

In the present embodiment, the term "vertical conductive channel" should be understood to include a conductive channel formed in a physically vertical direction and a conductive channel through which an electrical signal flows on a surface of a mold, passes through the mold, and is then supplied to a chip. Thus, even if a conductive channel is formed to obliquely pass through a surface of the mold 400 and extend to the chip 300 included in the mold 400, this conductive channel should be understood to fall within a range of a vertical conductive channel according to the present embodiment. In one embodiment, the optical device 110 is electrically connected to the vertical conductive channels 200a and 200b through the wire w bonded to the optical device 110. The wire w may be, for example, a gold wire.

The pads 312 and 322 through which an input signal is supplied to a circuit or an output signal is supplied to the outside are formed on the first surface 310 and the second surface 320 of the chip 300. The pad 322 formed on the second surface 320 of the chip 300 is electrically connected to the vertical conductive channels 200a and 200b to communicate an electrical signal with the optical device 110, and the pad 312 formed on the first surface 310 of the chip 300 is electrically connected to the wiring pattern 520 to communicate an electrical signal with the outside of the semiconductor package 12 or another chip included in the semiconductor package 12.

Third Embodiment

Figure 5:
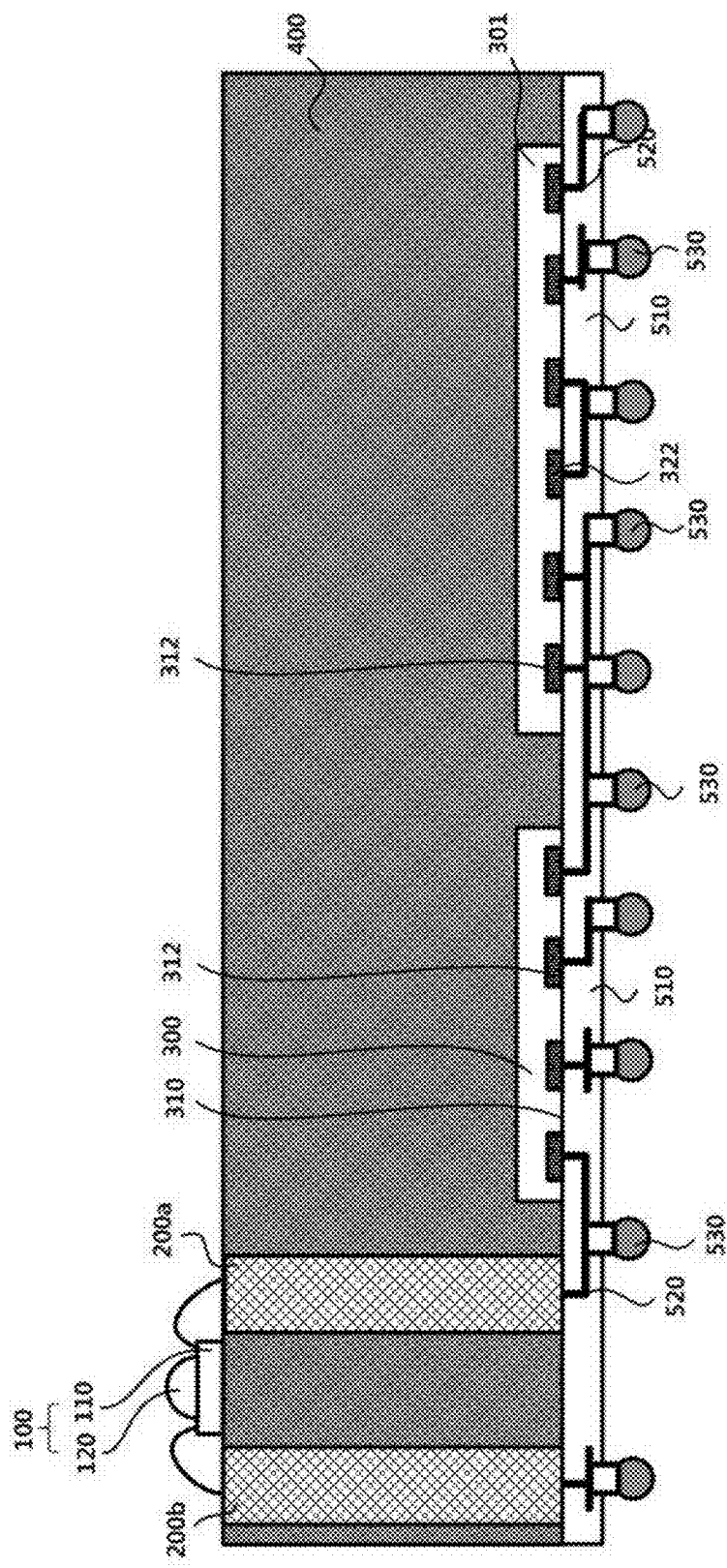
FIG. 5 is a schematic cross-sectional view of a semiconductor package having an optical interface according to a third embodiment.

FIG. 5 is a schematic cross-sectional view of a semiconductor package having an optical interface according to a third embodiment. A semiconductor package having an optical interface according to the third embodiment will be described with reference to FIG. 5 below. For a concise and clear description, parts that are the same or substantially the same as the previous embodiments may not be described again here. Referring to FIG. 5, a semiconductor package 14 according to the present embodiment includes a chip 300 having a first surface 310, a mold 400 which encapsulates the chip 300, vertical conductive channels 200a and 200b connected to the mold 400 while passing through the mold 400, an optical device 110 arranged on a surface of the semiconductor package 14 to be electrically connected to the vertical conductive channels 200a and 200b, a wiring pattern 520 electrically connecting the vertical conductive channels 200a and 200b and a pad formed on the first surface 310 of the chip 300 and performing electrical connection in the semiconductor package 14, and external connection terminals 530 electrically connecting the semiconductor package 14 to the outside.

The optical device 110 is electrically connected to the vertical conductive channels 200a and 200b through a pad formed on one surface of the optical device 110. In the first embodiment of FIG. 1, the optical device 110 is electrically connected to the vertical conductive channels 200a and 200b when the pads 112 formed on the rear surface of the optical device 110 and the wiring pattern 520 are in contact with one another. In contrast, in the present embodiment, pads (not shown) formed on a top surface of the optical device 110 and the vertical conductive channels 200a and 200b are electrically connected via a wire. The wire may be a gold wire as in the previous embodiments.

In the semiconductor package 14 according to the third embodiment, the vertical conductive channels 200a and 200b are formed by passing through the mold 400, and an exposed one end of the vertical conductive channel 200a and an exposed one end of the vertical conductive channel 200b are electrically connected to the chip 300 and a chip 301 through the wiring pattern 520 and are protected through a passivation layer 510.

For example, when the optical device 110 is a light-receiving device, an electrical signal supplied from the optical device 110 is transmitted to the vertical conductive channels 200a and 200b through a wire w. The electrical signal is transmitted to the chips 300 and 301 through the wiring pattern 520 electrically connected to the vertical conductive channels 200a and 200b. The chips 300 and 301 process the electrical signal. As another example, when the optical device 110 is a light-emitting device, the chips 300 and 301 generate electrical signals for driving the light-emitting device and transmit them to the wiring pattern 520 via a pad 312. The wiring pattern 520 transmits the electrical signals to the vertical conductive channels 200a and 200b, and the optical device 110 receives the electrical signals from the vertical conductive channels 200a and 200b via a wire, generates optical signals corresponding to the electrical signals and transmits the optical signals to the vertical conductive channels 200a and 200b.

Fourth Embodiment

Figure 6:
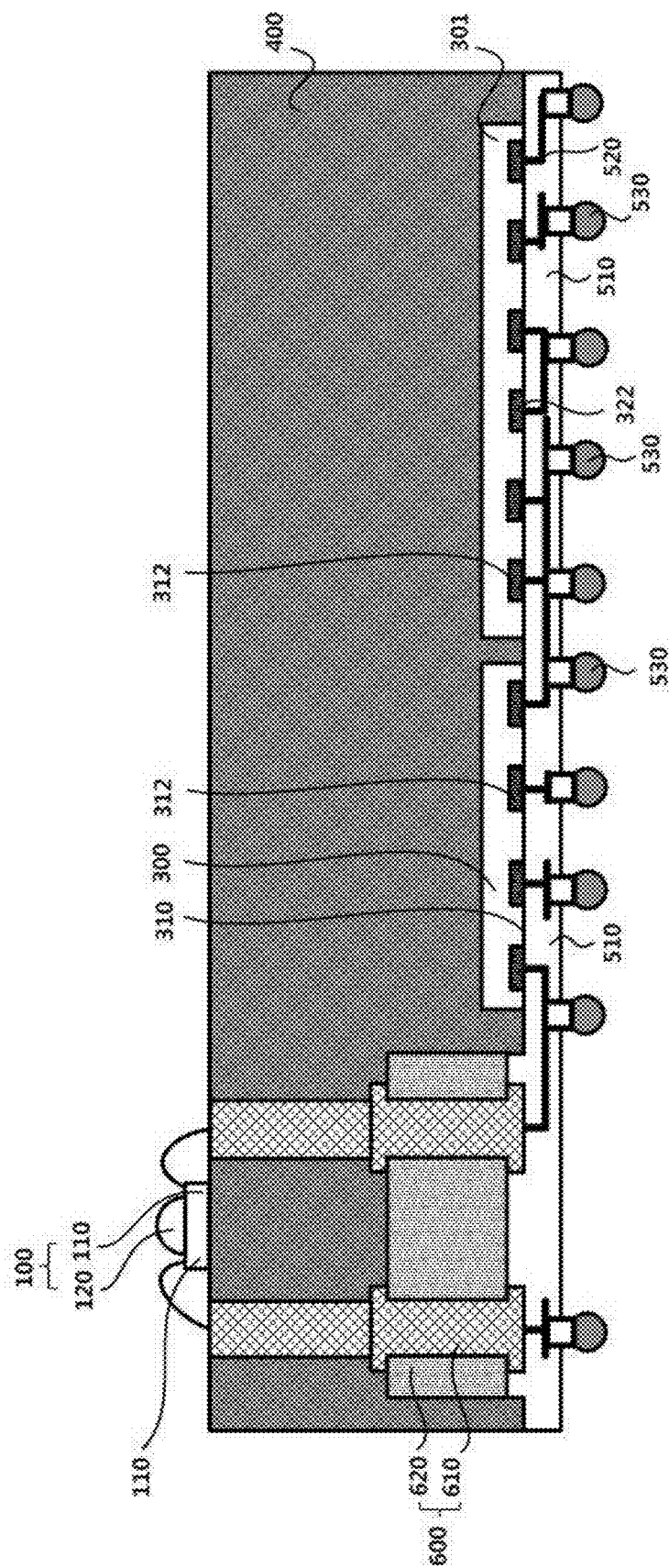
FIG. 6 is a schematic cross-sectional view of a semiconductor package having an optical interface according to a fourth embodiment.

FIG. 6 is a schematic cross-sectional view of a semiconductor package having an optical interface according to a fourth embodiment. A semiconductor package having an optical interface according to the fourth embodiment will be described with reference to FIG. 6 below. For a concise and clear description, parts that are the same or substantially the same as the previous embodiments may not be described again here. Referring to FIG. 6, a semiconductor package 16 according to the present embodiment includes a chip 300 having a pad formed on a first surface 310 thereof, a via-substrate 600 having a via 610, a mold 400 which encapsulates the chip 300 and the via-substrate 600, vertical conductive channels 200a and 200b connected to the via 610 while passing through the mold 400, an optical device 110 arranged on a surface of the semiconductor package 16 to be electrically connected to the vertical conductive channels 200a and 200b, a wiring pattern 520 electrically connecting the via 610 and the pad, and external connection terminals 530 electrically connecting the semiconductor package 16 to the outside.

The optical device 110 is electrically connected to the vertical conductive channels 200a and 200b via a wire. The vertical conductive channels 200a and 200b are electrically connected to a side of the via 610 formed on the via-substrate 600. The via-substrate 610 includes a thin-film substrate 620 formed of a thin film, and the via 610 passing through the thin-film substrate 620. The via-substrate 600 is molded with the chip 300 and a chip 301 to be included in the same package. The wiring pattern 520 is electrically connected to another side of the via 610. Thus, an electrical signal supplied from or to be supplied to the optical device 110 passes through the via 610 of the via-substrate 600.

Figure 7B:
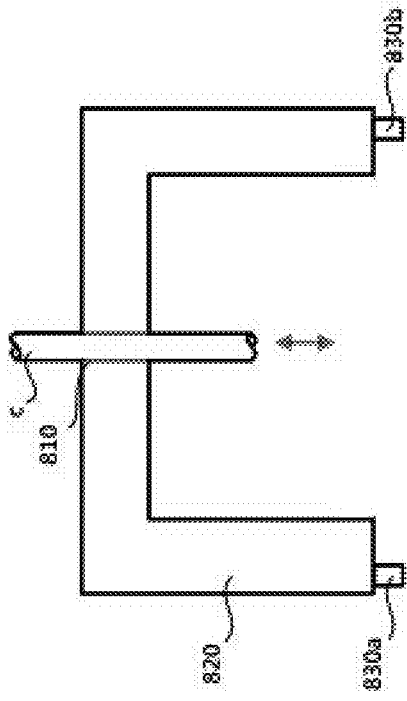
FIGS. 7A to 7D are diagrams schematically illustrating optical-cable fixing members according to embodiments.
Figure 7D:
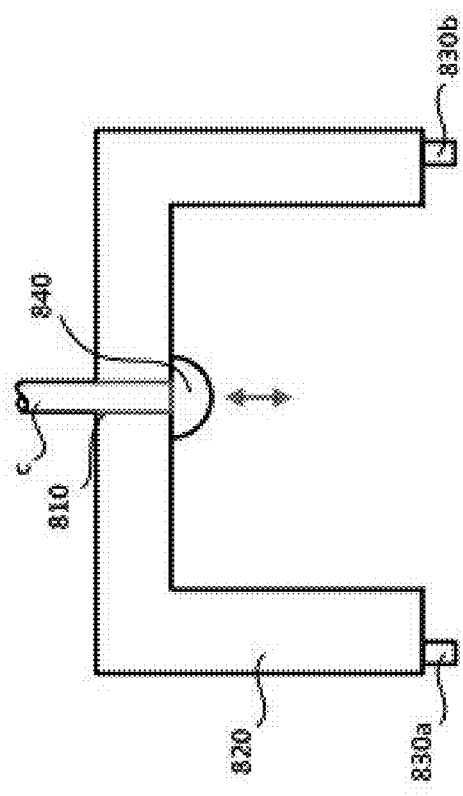
Figure 7A:
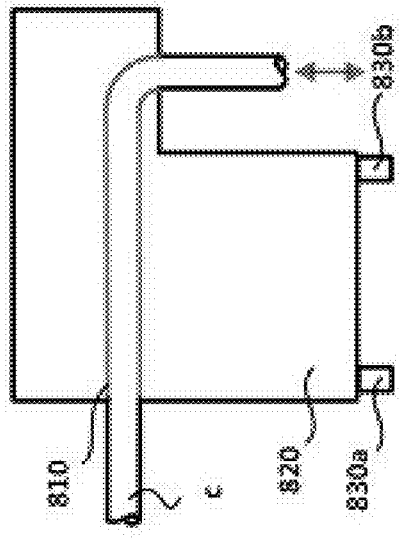

FIGS. 7A to 7D are diagrams schematically illustrating optical-cable fixing members according to embodiments of the present invention. Referring to FIGS. 7A and 7B, an optical-cable fixing member includes a housing 820 having an opening 810 into which an optical cable c is inserted, and two or more protrusions 830a and 830b to be inserted into a target object to fix the housing. The optical-cable fixing member guides the optical cable c when the optical cable c is inserted into the opening 410 (see FIG. 4), and fix the optical cable c not be separated.

Figure 7C:
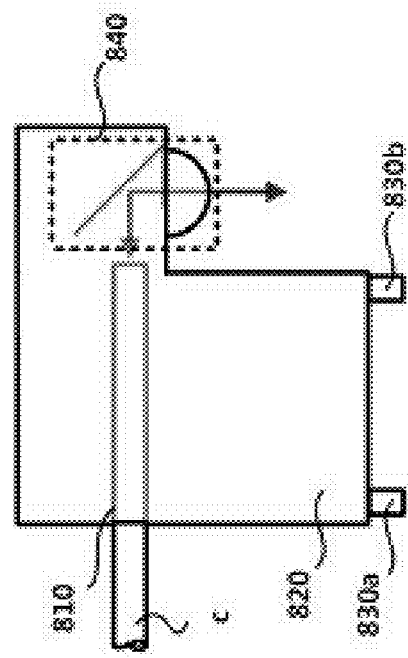

In an embodiment of FIGS. 7C and 7D, an optical-cable fixing member may further include an optical-path change member 840 which changes an optical path by reflecting or refracting an optical signal supplied via an optical cable c. For example, the optical-path change member 840 may include at least one among a prism, a mirror, a convex lens, and a concave lens.

Figure 8B:
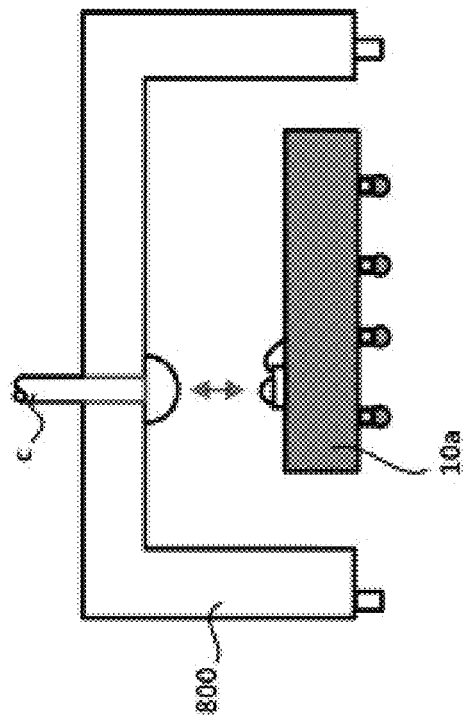
FIGS. 8A to 8D are diagrams schematically illustrating states in which an optical-cable fixing member is fixed.
Figure 8D:
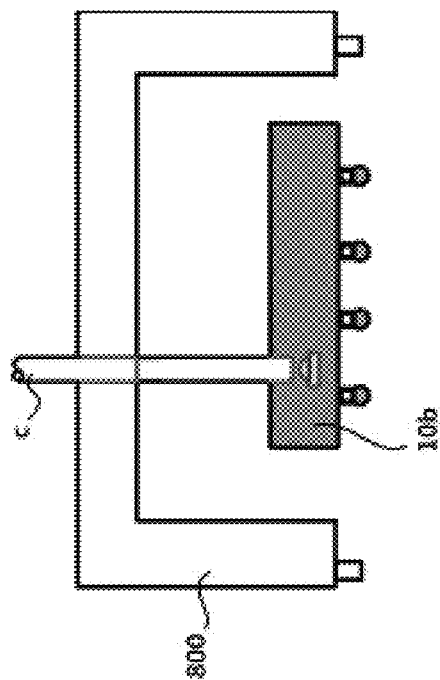
Figure 8A:
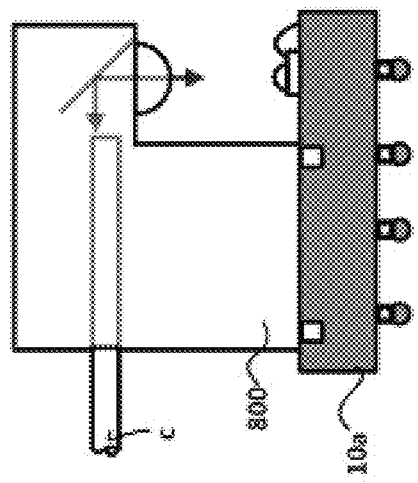
Figure 8C:
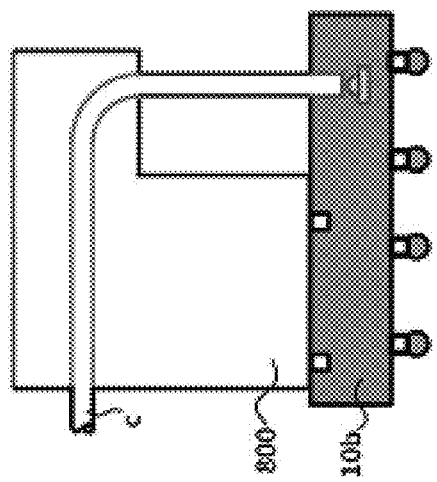

FIGS. 8A to 8D are diagrams schematically illustrating states in which an optical-cable fixing member is fixed. Referring to FIG. 8A, an optical-cable fixing member 800 may be aligned with a light-receiving device 110 to minimize an optical loss in a mold of a semiconductor package 10a having an optical interface. Referring to FIG. 8B, an optical-cable fixing member 800 may be arranged on a printed circuit board (not shown) to be aligned with a light-receiving device of the semiconductor package 10a so as to minimize an optical loss. Referring to FIG. 8C, an optical-cable fixing member 800 guides an optical cable c to be inserted into an opening of a semiconductor package 10b and fixes the optical cable c to not be separated from the semiconductor package 10b. The optical-cable fixing member 800 may be fixed on a mold of the semiconductor package 10b as illustrated in FIG. 8C or may be fixed on a printed circuit board (not shown) as illustrated in FIG. 8D.

Although not shown, the optical-cable fixing members 800 illustrated in FIGS. 8A and 8C may be arranged on a printed circuit board (not shown) and the optical-cable fixing members 800 illustrated in FIGS. 8B and 8D may be arranged on the molds of the semiconductor packages 10a and 10b, respectively.

Although it is illustrated that the optical-cable fixing members 800 according to the embodiments of FIGS. 8A and 8B include a lens part, the present invention is not limited thereto and the optical-cable fixing members 800 may not include a lens part. Furthermore, in the embodiments of FIGS. 8C and 8D, the optical cable c is inserted into the mold via the opening, but when the mold is a transparent mold, the optical cable c may communicate with an optical device without having to insert the optical cable c into the opening as described above.

Figure 9A:
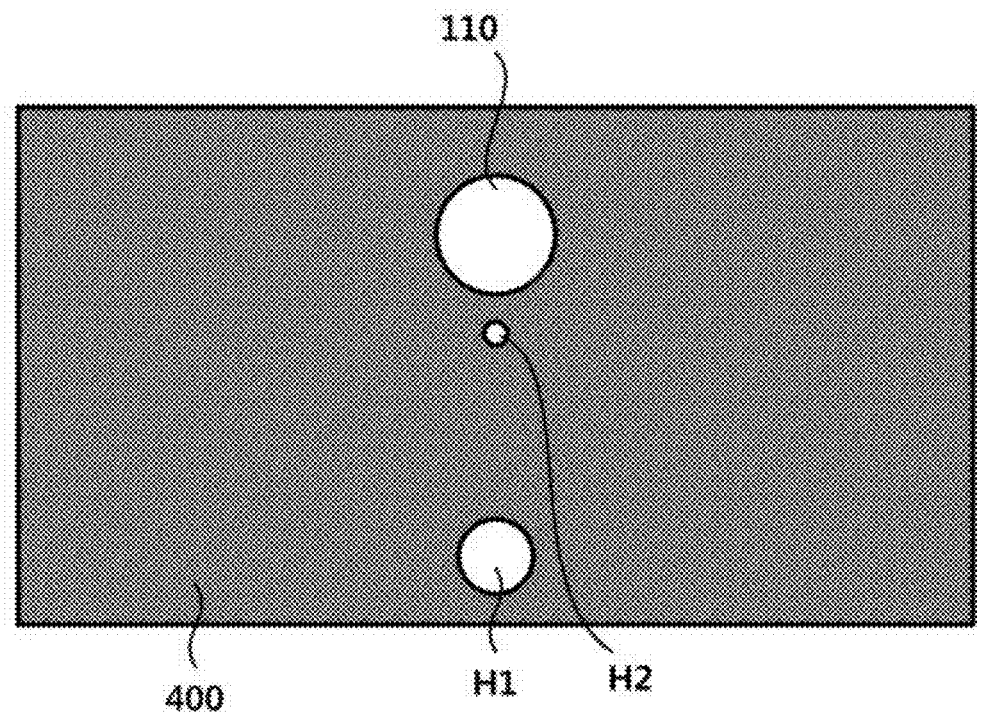
FIGS. 9A and 9B are diagrams illustrating structures for minimizing an optical loss between an optical device and an optical-cable fixing member when the optical device is arranged on a surface of a mold.
Figure 9B:
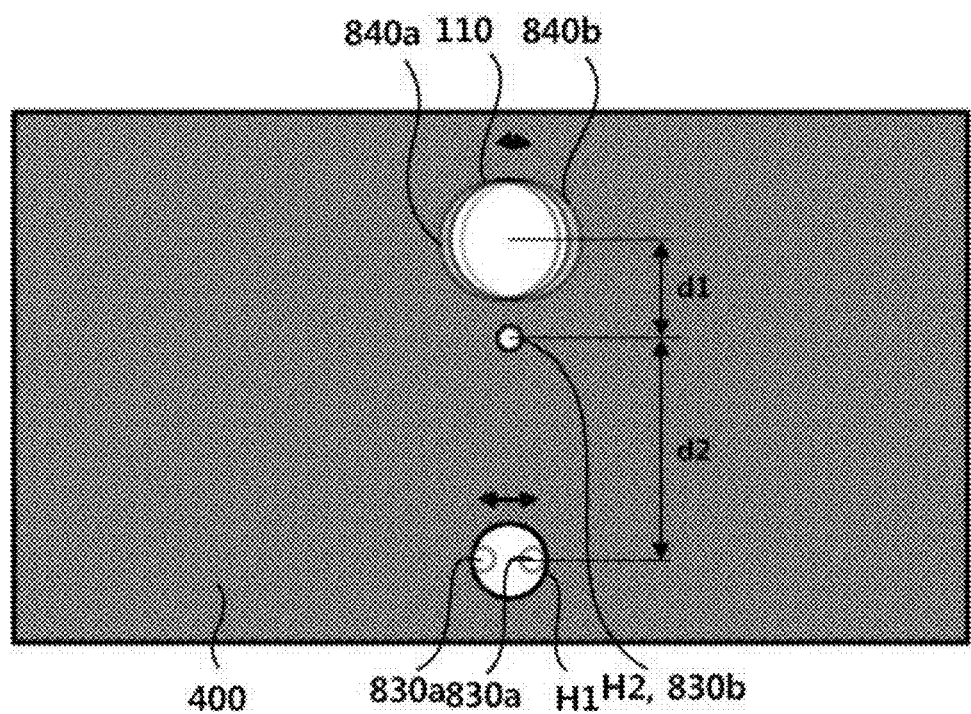

FIGS. 9A and 9B are diagrams illustrating structures for minimizing an optical loss between an optical device and an optical-cable fixing member when the optical device is arranged on a surface of a mold. Holes H1 and H2 are formed on a surface of the mold 400 to align the optical-cable fixing member. As illustrated in FIG. 9A, the hole H2 adjacent to the optical device 110 is formed to be smaller in diameter than the hole H1 which is more distant from the optical device 110 than the hole H2. Furthermore, the distance d2 between the center of the hole H1 and the center of the hole H2 is set to be greater than the distance d1 between the center of the hole H2 and the center of the optical device 110.

FIG. 9B is a diagram schematically illustrating a process of aligning an optical-cable fixing member and an optical device 110 with each other. The optical-cable fixing member includes two protrusions 830a and 830b for a purpose of fixing. The two protrusions 830a and 830b are respectively inserted into holes H1 and H2. The diameters of the protrusions 830a and 830b are equal to that of the hole H2 and are less than that of the hole H1. Thus, the optical-cable fixing member may pivot about the protrusion 830b inserted into the hole H2 as the protrusion 830a is moved.

An optical-path change member 840 attached to the optical-cable fixing member is moved within a range from a position 840a to a position 840b as illustrated in FIG. 9B. That is, since the distance d2 between the centers of the hole H1 and the hole H2 is greater than the distance d1 between the centers of the hole H2 and the optical device 110, a range of movement of the optical-cable fixing member is not large although the protrusion 830a is moved within the hole H1. Thus, in order to minimize a loss of light provided from the optical-cable fixing member, the optical-path change member 840 may be arranged on the mold 400. After the arrangement of the optical-path change member 840, the optical-path change member 840 is fixed onto the mold 400.

FIGS. 9A and 9B illustrate cases in which the optical-cable fixing member is fixed onto a surface of the mold 400. However, the present invention is not limited thereto, and a package according to an embodiment of the present invention may be fixed on a printed circuit board (not shown) and then an optical-cable fixing member may be fixed on the printed circuit board by applying the structure illustrated in FIG. 9A or 9B.

Fifth Embodiment

Figure 10B:
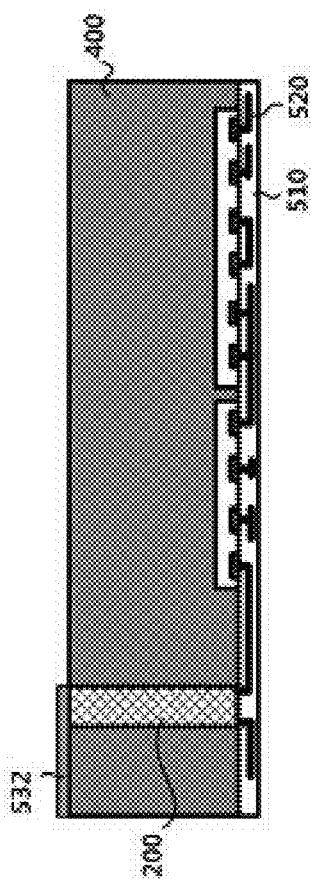
FIGS. 10A to 10D are diagrams schematically illustrating external connection terminals of a semiconductor package according to embodiments.
Figure 10A:
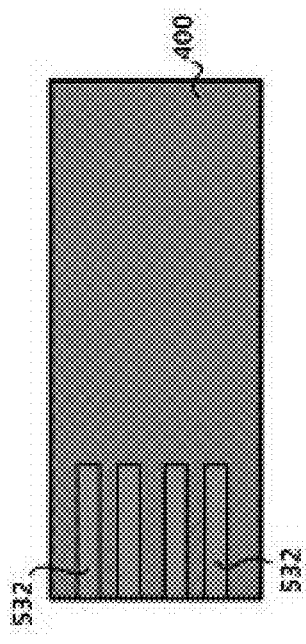

FIGS. 10A to 10D are diagrams schematically illustrating external connection terminals of a semiconductor package as described above according to embodiments. FIG. 10A is a top view of an example of a semiconductor package according to a fifth embodiment. Referring to FIG. 10A, an external connection terminal 530 may include conductive strips 532 formed on a surface of a mold 400. In one embodiment, the arrangement, specifications, and functions of the conductive strips 532 satisfy a data transmission standard. For example, the conductive strips 532 satisfy a data transmission standard such as Universal Serial Bus (USB), IEEE 1394 Firewire, Thunderbolt, lightning, High-Definition Multimedia Interface (HDMI), or the like.

Figure 10D:
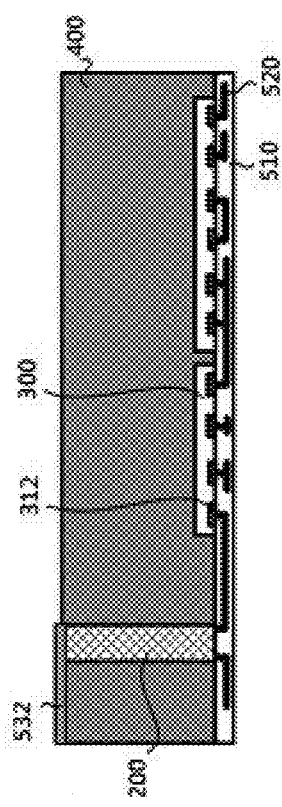
Figure 10C:
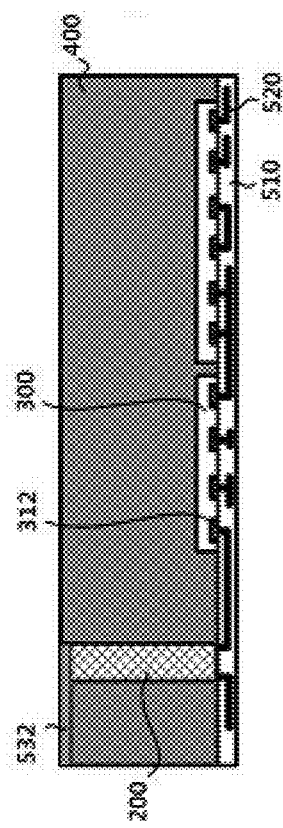

FIGS. 10B to 10D are cross-sectional views of examples of a semiconductor package according to the fifth embodiment. Referring to FIGS. 10B to 10D, conductive strips 532 formed on a surface of a mold 400 are electrically connected to a wiring pattern 520 via a vertical conductive channel 200 passing through the mold 400, and are electrically connected to pads 312 of a chip 300 via the wiring pattern 520 to transmit an electrical signal to the chip 300 or receive an electrical signal from the chip 300.

In an embodiment of FIG. 10B, the conductive strips 532 may protrude from the surface of the mold 400. In an embodiment of FIG. 10C, surfaces of the conductive strips 532 which are electrically connected to the outside may be exposed from the mold 400 to be parallel with the surface of the mold 400. Furthermore, in an embodiment of FIG. 10D, the conductive strips 532 may be included in the mold 400 such that they protrude from the surface of the mold 400.

Figure 11B:
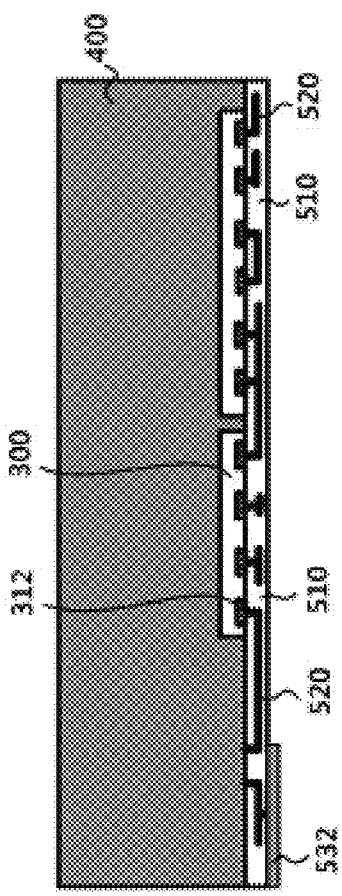
FIGS. 11A to 11D are diagrams schematically illustrating external connection terminals of a semiconductor package according to other embodiments.
Figure 11A:
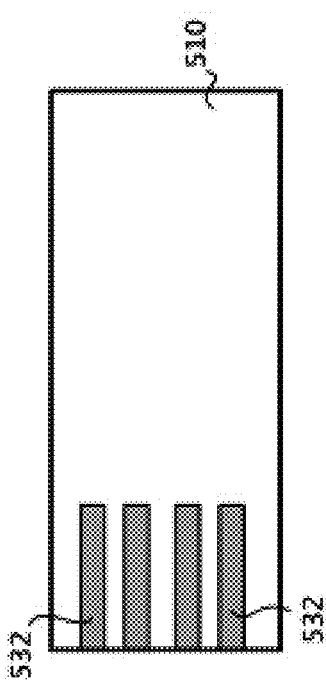

FIGS. 11A to 11D are diagrams schematically illustrating external connection terminals of a semiconductor package as described above according to other embodiments. FIG. 11A is a top view of another example of a semiconductor package according to the fifth embodiment. Referring to FIG. 11A, an external connection terminal 530 may include conductive strips 532 formed on a surface of a passivation layer 510. In one embodiment, the arrangement, specifications, and functions of the conductive strips 532 satisfy a data transmission standard. For example, the conductive strips 532 satisfy a data transmission standard such as USB, IEEE 1394 Firewire, Thunderbolt, lightning, HDMI, etc.

Figure 11D:
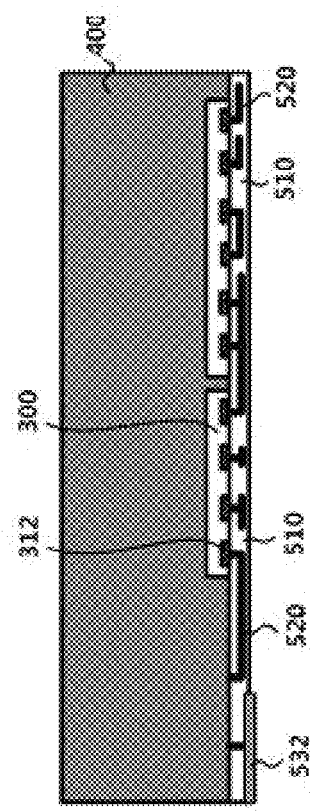
Figure 11C:
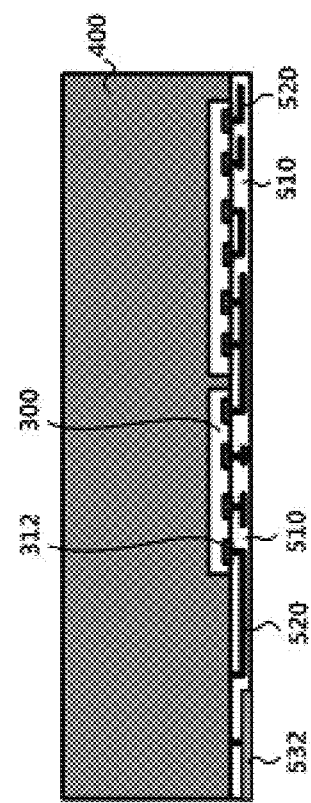

FIGS. 11B to 11D are cross-sectional views of examples of a semiconductor package according to the fifth embodiment. Referring to FIGS. 11B to 11D, conductive strips 532 formed on a surface of a passivation layer 510 are electrically connected to a wiring pattern 520. The conductive strips 532 are electrically connected to pads 312 of a chip 300 via the wiring pattern 520 to transmit an electrical signal to the chip 300 or receive an electrical signal from the chip 300.

In the embodiment of FIG. 11B, the conductive strips 532 may protrude from the surface of the passivation layer 510. In the embodiment of FIG. 11C, surfaces of the conductive strips 532 which are electrically connected to the outside may be exposed from the passivation layer 510 to be parallel with the surface of the passivation layer 510. Furthermore, in the embodiment of FIG. 11D, the conductive strips 532 may be included on a mold 400 such surfaces thereof electrically connected to the outside protrude from the surface of the passivation layer 510.

In one embodiment (not shown), the conductive strips 532 may be electrically connected to pads formed on a second surface 320 of the chip (see FIG. 4) via a vertical conductive channel 200 to transmit an electrical signal to the chip 300 or receive an electrical signal from the chip 300. In another embodiment (not shown), the conductive strips 532 may be electrically connected to a via 610 formed on a via-substrate 600 (see FIG. 6) via the vertical conductive channel 200. An electrical signal may be transmitted to the chip 300 or received from the chip 300 via a wire path connected to the via-substrate 600.

Figure 12A:
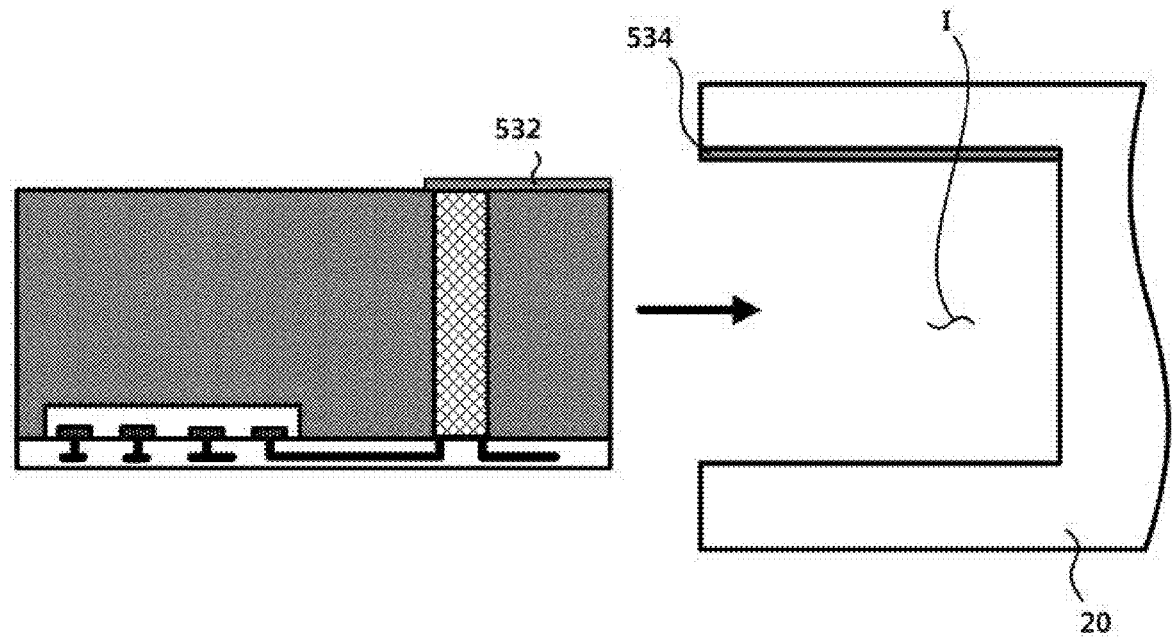
FIGS. 12A and 12B are schematic cross-sectional views illustrating examples of a state in which a semiconductor package according to a fifth embodiment and an external device are combined with each other.
Figure 12B:
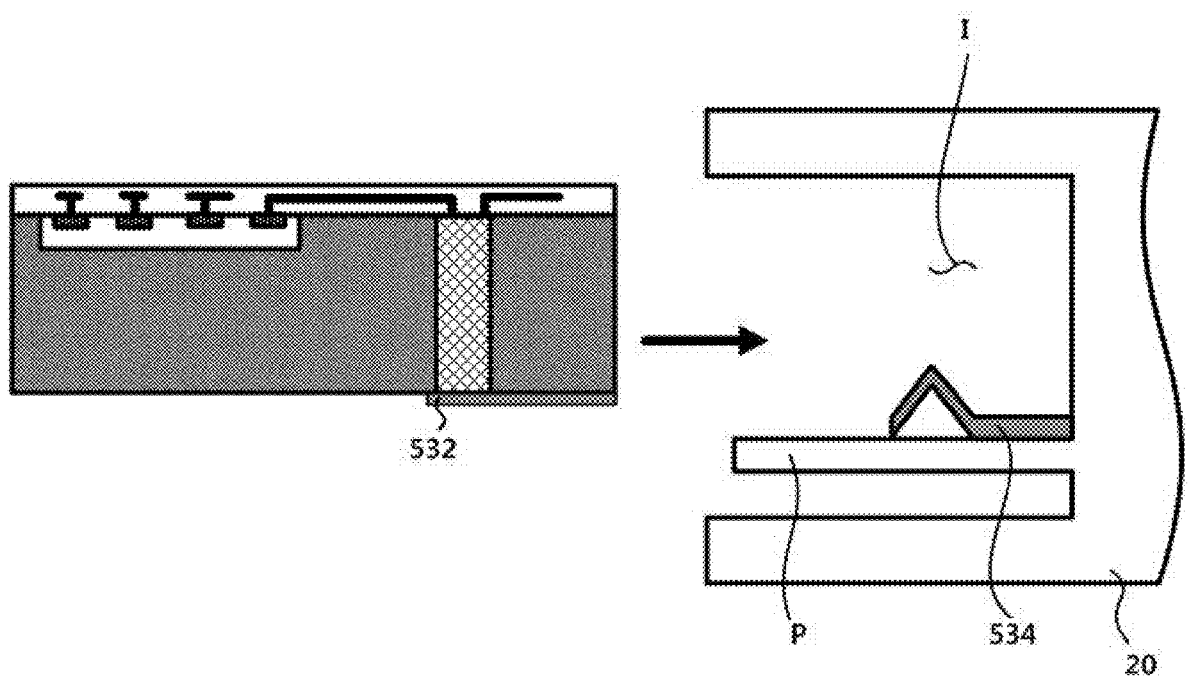

FIGS. 12A and 12B are schematic cross-sectional views illustrating examples of a state in which a semiconductor package according to the fifth embodiment and an external device are combined with each other. Referring to FIG. 12A, a conductive strip 532 is formed on a semiconductor package 10 according to the fifth embodiment. An external device 20 may have an opening I into which the semiconductor package 10 is inserted to be mechanically fixed with the external device 20. In the opening I, an external connection terminal 534 corresponding to the conductive strip 532 which is an external connection terminal of the semiconductor package 10 may be formed. The conductive strip 532 which is an external connection terminal formed on the semiconductor package 10 and the external connection terminal 534 formed in the opening I may be electrically connected to each other such that one of the conductive strip 532 and the external connection terminal 534 may transmit an electrical signal to the other and/or receive an electrical signal from the other, and supply driving power to the other. In an embodiment of FIG. 12A, the semiconductor package 10 and the external device 20 are fixed with each other by combining them by inserting one of them into the other.

FIG. 12B is a schematic cross-sectional view illustrating another example of a state in which a semiconductor package 10 and an external device 20 are combined with each other according to the fifth embodiment. Referring to FIG. 12B, the semiconductor package 10 according to the fifth embodiment includes a conductive strip 532, and the external device 20 includes an opening I into which the semiconductor package 10 is inserted. In the opening I, a protrusion part P is arranged. An external connection terminal 534 which is to be electrically connected to the conductive strip 532 formed in the semiconductor package 10 is provided on the protrusion part P. In an embodiment of FIG. 12B, the external connection terminal 534 may be electrically connected to the conductive strip 532 formed in the semiconductor package 10, and have a spring form to apply an elastic force to the semiconductor package 10 so that the semiconductor package 10 inserted into the opening I may be fixed in the opening I. In the embodiment of FIG. 12B, the semiconductor package 10 and the external device 20 are combined and fixed with each other by inserting one of them into the other and/or through an elastic force applied by the external connection terminal 534 formed in the external device 20.

Figure 13:
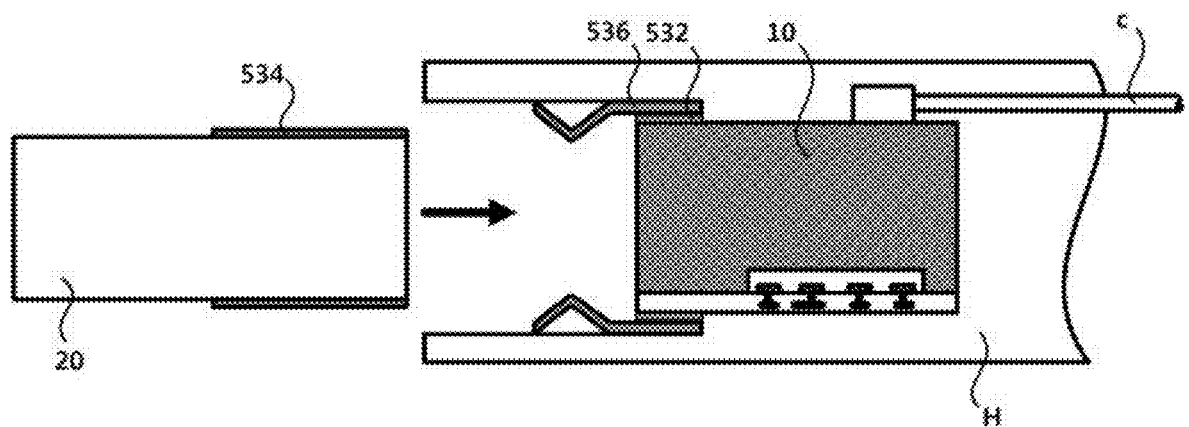
FIG. 13 is a schematic cross-sectional view illustrating another example of a state in which a semiconductor package according to the fifth embodiment and an external device are combined with each other.

FIG. 13 is a schematic cross-sectional view illustrating another example of a state in which a semiconductor package 10 according to the fifth embodiment and an external device 20 are combined with each other. Referring to FIG. 13, the semiconductor package 10 according to the fifth embodiment may receive a signal from an optical cable c or transmit a signal to the optical cable c. The semiconductor package 10 may further include a housing H compared to the previous embodiments, and may fix the optical cable c more safely through the housing H.

In the housing H, an intermediate connection terminal 536 is provided. The intermediate connection terminal 536 is electrically connected to a conductive strip 532 which is an external connection terminal of the semiconductor package 10. Furthermore, the intermediate connection terminal 536 is electrically connected to an external connection terminal 534 of the external device 20 so that the external device 20 and the semiconductor package 10 may be electrically connected to each other.

The intermediate connection terminal 536 provided in the housing H may have a spring form and be thus combined with the external device 20 by applying an elastic force to the external device 20 as illustrated in FIG. 13. In an embodiment (not shown), the external device 20 may be inserted into the housing H to be combined with the housing H, and the intermediate connection terminal 536 may have a strip form and is electrically connected to the external connection terminal 534 of the external device 20.

In the appended drawings, only one optical device is illustrated for better understanding of the invention, and both a light-receiving device and a light-emitting device may be provided to form a package capable of transmitting and receiving an optical signal.

According to the above embodiments, an optical device configured to convert an optical signal supplied from an optical cable into an electrical signal or convert an electrical signal into an optical signal and provide the optical signal to the optical cable, and an optical interface including chips may be included in a package which is the same as chips for processing an electrical signal. Thus, problems of the related art, e.g., deterioration of an electrical signal caused when an optical interface and chips for processing an electrical signal are spaced apart from each other and a large area of a circuit board, may be overcome, and a system which has a substrate having a smaller area and which is capable of transmitting and/or receiving an optical signal and converting and processing the optical signal may be formed within a single package.

According to the above embodiments, an optical device and a circuit or system capable of processing an electrical signal may be included in the same package. Thus, the area of a circuit board may be decreased and an electrical signal may be prevented from deteriorating.

While the present invention has been particularly shown and described with reference to the embodiments illustrated in the drawings to assist understanding of the present invention, it will be understood by those of ordinary skill in the art that various changes in form and details may be made therein without departing from the spirit and scope of the invention as defined by the appended claims. Therefore, the scope of the invention is defined by the appended claims.

What is claimed is:
1. A semiconductor package comprising:
   a chip having a first surface and a second surface;
   a mold configured to encapsulate the chip;
   a vertical conductive channel electrically connected to a pad formed on the second surface of the chip while passing through the mold;
   a wiring pattern electrically connected to a pad formed on the first surface of the chip and configured to perform electrical connection in the package;
   an optical device arranged on a surface of the semiconductor package to be electrically connected to the vertical conductive channel; and
   an external connection terminal configured to electrically connect the semiconductor package to the outside.
2. The semiconductor package of claim 1, wherein the chip comprises at least one of:
   an amplifier circuit configured to process an electrical signal supplied from the optical device; and
   a driver circuit configured to supply the electrical signal to the optical device.
3. The semiconductor package of claim 1, wherein the semiconductor package comprises a plurality of chips, wherein the plurality of chips comprise at least one of:
   a chip including an amplifier circuit; and
   a chip including a driver circuit.
4. The semiconductor package of claim 1, further comprising at least one signal processing chip.
5. The semiconductor package of claim 1, wherein the mold is a hardened epoxy mold compound (EMC).
6. The semiconductor package of claim 1, wherein the semiconductor package comprises a plurality of chips, wherein the wiring pattern electrically connects the plurality of chips to one another.
7. The semiconductor package of claim 1, wherein the optical device comprises at least one of:
   a light-emitting device; and
   a light-receiving device.
8. The semiconductor package of claim 7, wherein the light-emitting device comprises one of:
   a light-emitting diode; and
   a vertical cavity surface emitting laser (VCSEL), and
   wherein the light-receiving device is a photodiode.
9. The semiconductor package of claim 1, wherein the optical device comprises at least one of:
   an optical module configured to disperse or concentrate light; and
   a transparent film.
10. The semiconductor package of claim 1, wherein the optical device and the vertical conductive channel are electrically connected to each other via a pad formed on one surface of the optical device and by wire-bonding with the vertical conductive channel or are electrically connected to each other when a pad formed on a rear surface of the optical device is connected to the vertical conductive channel.

11. The semiconductor package of claim 1, wherein the external connection terminal comprises a solder ball or a metal bump.

12. The semiconductor package of claim 1, further comprising an optical-cable fixing member configured to fix an optical cable which communicates an optical signal with the semiconductor package.

13. The semiconductor package of claim 12, wherein the optical-cable fixing member comprises:
    a housing; and
    an opening formed through which the optical cable is inserted into the housing.

14. The semiconductor package of claim 12, wherein the optical-cable fixing member further comprises an optical-path change member configured to reflect or refract an optical signal supplied between the optical cable and the optical device so as to change a path of the optical signal.

15. The semiconductor package of claim 12, wherein the optical-cable fixing member is aligned with the optical device, and is arranged on either the mold or a circuit board having the semiconductor package thereon.

16. The semiconductor package of claim 12, wherein the optical-cable fixing member further comprises an optical module configured to disperse or concentrate an optical signal supplied via the optical cable or an optical signal to be supplied to the optical cable.

17. The semiconductor package of claim 1, wherein the external connection terminal comprises a conductive strip provided on a surface of the semiconductor package.

18. The semiconductor package of claim 17, wherein the conductive strip is arranged to satisfy a data transmission standard.

19. The semiconductor package of claim 18, wherein the data transmission standard comprises one of Universal Serial Bus (USB), IEEE 1394 Firewire, Thunderbolt, lightning, and High-Definition Multimedia Interface (HDMI).

20. The semiconductor package of claim 1, wherein the semiconductor package is accommodated in a housing,
    wherein the housing fixes an optical cable via which an optical signal is transmitted to or received from the optical device.

21. The semiconductor package of claim 1, wherein the semiconductor package is accommodated in a housing,
    wherein the housing comprises an intermediate connection terminal configured to electrically connect an external device and the semiconductor package to each other.

\* \* \* \* \*